United States Patent
Alter

(10) Patent No.: US 6,711,046 B1
(45) Date of Patent: Mar. 23, 2004

(54) PROGRAMMABLE OPTICAL ARRAY

(75) Inventor: Martin Alter, Los Altos, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 09/891,740

(22) Filed: Jun. 25, 2001

(51) Int. Cl.$^7$ ............... G11C 11/36; G11C 13/04

(52) U.S. Cl. ............. 365/115; 365/243; 365/234

(58) Field of Search ............... 365/115, 243, 365/234, 237

(56) References Cited

U.S. PATENT DOCUMENTS

| | | | | |
|---|---|---|---|---|
| 5,285,131 A | * | 2/1994 | Muller et al. | 313/578 |
| 5,796,094 A | * | 8/1998 | Schofield et al. | 250/208.1 |
| 6,208,012 B1 | | 3/2001 | Oishi | 257/565 |
| 6,208,463 B1 | * | 3/2001 | Hansen et al. | 359/486 |
| 6,452,724 B1 | * | 9/2002 | Hansen et al. | 359/486 |
| 6,548,967 B1 | * | 4/2003 | Dowling et al. | 315/318 |

OTHER PUBLICATIONS

Samuel K. Moore, "Making Chips To Probe Genes—Biochips are now a critical tool for analyzing the human genome–and a lucrative product attracting technology giants", IEEE Spectrum, Mar. 2001, pp. 54–60.

* cited by examiner

Primary Examiner—Thong Q. Le
(74) Attorney, Agent, or Firm—Bever, Hoffman & Harms, LLP; James E. Parsons; John M. Kubodera

(57) ABSTRACT

Programmable semiconductor elements, such as zener diodes, are used in an optical array. In one embodiment, an array of zener diodes is formed on a substrate surface and selectively zapped (programmed) to create a reflective filament between anode and cathode contacts of the selected zener diodes. Light is then applied to the surface. The reflected (or transmitted) light pattern may be used for conveying optical information or exposing a photoresist layer. In one use of the array to selectively expose a photoresist layer, the array helps to determine which genes have been expressed in a BioChip. Devices other than zener diodes may also be programmed to create a reflective filament for optically conveying information, such as bipolar transistors, MOSFETS, and non-semiconductor devices. The reflective filament can be a portion of a fuse or anti-fuse.

62 Claims, 2 Drawing Sheets

PROGRAMMABLE OPTICAL ARRAY

FIELD OF THE INVENTION

This invention relates to an optical array and, in particular, to a one-time programmable optical array for conveying optical information.

BACKGROUND

One application for optical switches is in the optical communications field, where each "cell" in the array is controlled to either reflect light or not reflect light. One embodiment of such a switch comprises an array of electromechanically controlled micro-mirrors. The angle of each mirror is controlled to selectively reflect light (carrying a data stream) from an input optical fiber to another fiber. Such micro-electromechanical switches are generally referred to as MEMS switches. These devices are popular due to their flexibility but, due to the mechanical nature of their operation, they can be sensitive to vibrations and contamination.

Other types of optical switches include liquid crystals, electro-optic devices, acousto-optic devices, and thermo-optic devices.

Each of the presently known optical switches is complex, relatively expensive, and requires complex control circuitry. Such optical arrays can not only be used for dynamic switching of optical information but can also be used as a static memory, whereby stored bits are represented by whether a location on an array reflects light in a particular direction or not at all. In many applications, the flexibility of the dynamically controlled optical switches is unnecessary and adds a significant cost to the optical system.

What is needed is a simple, reliable, and inexpensive optical switch.

SUMMARY

In one embodiment of the invention, an array of programmable zener diodes constitutes an optical switch array. Zener diodes in the array are formed such that when a sufficiently high programming current flows through the zener diode, aluminum atoms from a contact are caused to quickly migrate laterally between the anode and cathode contacts to form a conductive filament. Such diodes are frequently used as anti-fuses. Programming such zener diodes is commonly referred to as zapping. This resulting aluminum filament (or ribbon) is reflective and can act as a tiny mirror for reflecting light. Since these zener diodes may each be less than about 10 microns wide, a large number of these zener diodes may be formed on a substrate using conventional photolithographic processes.

In one embodiment of a system using such a zener diode optical array, optical fibers are arranged proximate to the array of switches, and whether a zener diode is "zapped" or not determines whether light exiting an optical fiber is reflected back into another optical fiber.

In another use of the invention, ultraviolet light may be reflected off the optical array, and the reflection is used in a photolithography process to selectively expose photosensitive portions on another substrate. The light source may be a laser or other source. Such an inexpensive optical array may be used instead of a mask for prototyping or for other uses, such as creating biochips incorporating DNA microarrays.

Other applications of the array are described herein. Other types of one-time programmable elements besides zener diodes may also be used to create reflective metal portions on a substrate.

DETAILED DESCRIPTION AND EMBODIMENTS

Figure 1:
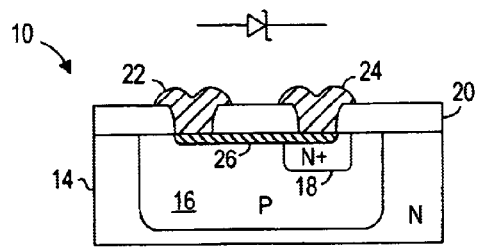
FIG. 1 is a cross-sectional view of a single zener diode in an array of zener diodes, where the diode has been programmed (or "zapped") to create a reflective filament between the two contacts.

FIG. 1 is a cross-sectional view of a zener diode 10. Conventional zener diodes have a reverse breakdown voltage that is sometimes used for creating a predetermined voltage across two nodes. A zener diode can be designed such that, at a high enough current, the zener diode permanently shorts its anode contact to its cathode contact with the contact metal. Such is the case with the zener diodes used in accordance with one embodiment of the invention.

In FIG. 1, an n-type silicon substrate 14 has formed in it by conventional photolithographic processes a ptype region 16. In one embodiment, the final p-type region has a depth of approximately 1 micron and a width of less than 10 microns.

Within p-type region 16 is formed an n-type region 18 to a depth of, for example, 0.4 micron.

An oxide layer 20 is then grown over the exposed surface of the silicon wafer to a thickness of, for example, 1 micron. Openings are then etched into oxide layer 20 to expose a portion of p-type region 16 and n-type region 18. Metal is then deposited and etched to form anode contact 22 and cathode contact 24. Examples of suitable contact materials include Al, AlSi, AlCu, AlSiCu, and other known materials. A thin barrier metal such as Ti or TiN may be deposited between the contact metal and the substrate and can be readily "zapped" thru.

One way to "zap" these devices to form tiny mirrors is as follows. At above the reverse breakdown voltage of the zener diode 10, a current will flow between contacts 22 and 24. At a sufficiently high current with a sufficiently high electric field and resulting temperature, aluminum atoms from contact 22 will migrate between the oxide/silicon interface and ultimately short contact 22 to contact 24. FIG. 1 shows this shorting metal a filament 26. The filament 26 may only extend to region 18 in certain situations. In one embodiment, the thickness of filament 26 is approximately 100 Angstroms, and its width is typically greater than 1 micron, depending on the size of contacts 22 and 24 and other geometrical factors. Since the contacts are primarily aluminum, which is a reflective metal, filament 26 will reflect light to a certain degree.

In one embodiment, the reverse breakdown voltage is 10 volts, and the programming current is between 50 mA–300 mA. The temperature of the structure during programming should become sufficiently high so that the portion of the aluminum contact 22 supplying the filament 26 material is essentially melted as it is transported by the high current flow and electric field. In one embodiment, an alloy of aluminum forming a eutectic is used to form contacts 22 and 24. If a barrier layer (e.g., Ti or TiN) is used, the barrier layer material and thickness are selected to allow the aluminum to migrate through the barrier layer during programming.

A zener diode may also be programmed by forward biasing under certain conditions. Examples of other types of zener zap diodes are found in U.S. Pat. No. 6,208,012, incorporated herein by reference.

The structure of FIG. 1 is advantageous to use in the present invention since the filament 26 is self-passivated by the overlying oxide 20, so remains clean and not sensitive to vibration or corrosion.

A zapped zener diode has a resistivity between the two contacts on the order of 0.5 ohms. The zapping of zener diodes, similar to that shown in FIG. 1, is commonly used in integrated circuits to trim bandgap reference voltage generators. Such zapping of zener diodes is also used for setting codes in logic.

Figure 2:
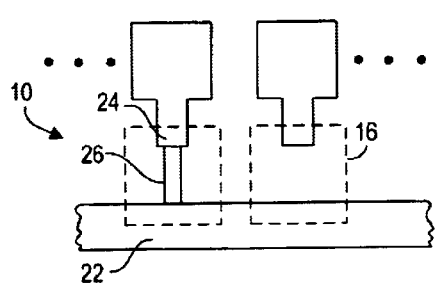
FIG. 2 is a top-down view of two of the zener diodes in an array, where one of the diodes has been zapped to reflect light.

FIG. 2 is a top-down view of two zener diodes in a larger array of zener diodes. Contacts 24 are shown terminating in separate contact pads for the various zener diodes, while contact 22 is shown as a common contact for at least a row of zener diodes in the array. The width of the filament 26 can be made any size (e.g., 1–4 microns or greater), as required for suitable light reflection. If it is desired to have a dense array of zener diodes, metal traces leading to the anodes and cathodes of the various diodes may terminate in contacts or pads around the periphery of the chip. Alternatively, a suitable address decoder may be formed on the chip for selectively addressing rows and columns in the array for programming so as to minimize the number of package pins required.

If reflections from the metal lines leading to the contacts are problematic, the metal lines may be formed in areas where any reflection does not affect the function of the array for a particular application. Also, the light to be reflected may be directed only to the areas between the contacts. This may be done using a light absorbing shield, over the array, having small holes in only the area between the contacts, or a laser can be x-y controlled to only apply light to the areas between the contacts.

Figure 3:
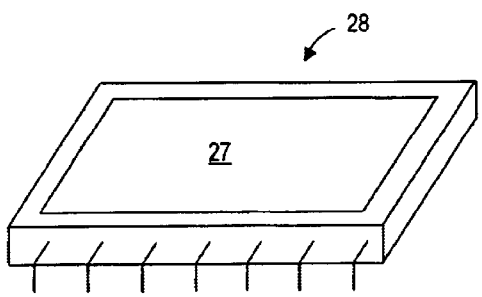
FIG. 3 illustrates a packaged optical array including a window.

The resulting chip having an array of zener diodes may optionally be packaged, as shown in FIG. 3, such that a window 27 in the package 28 gains optical access to the chip. The package may use ball grid array, pins, or any other type of terminals for programming the diodes. Alternatively, the bare chip can be adhesively bonded to a substrate and the chip's contacts wire bonded to terminals on the substrate.

Figure 4:
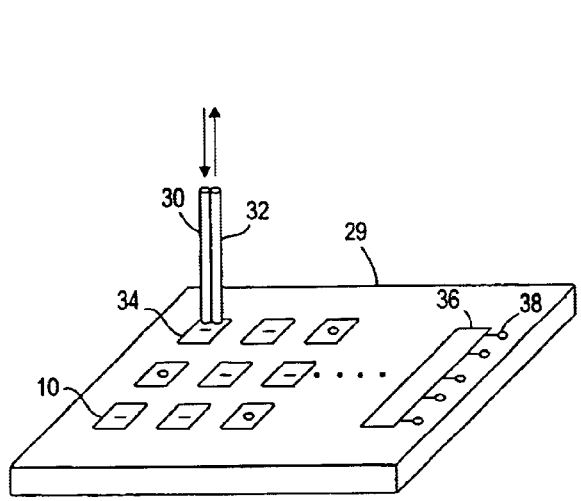
FIG. 4 is a perspective view of an array of selectively zapped zener diodes, each representing an on or off state, for reflecting light into an array of optical fibers.

FIG. 4 is a perspective view of the use of the programmed chip 29 as an optical switch. Each of the zener diodes 10 is selectively zapped, creating an on state (logical 1), or not zapped, creating an off state (logical 0). An input optical fiber 30 and an output optical fiber 32 are brought proximate to one of the zener diodes 34. In a practical embodiment, an array of such fibers would be held in place with a support structure and brought proximate to the surface of the array. If the diode 34 has been zapped, light emitted from an end of fiber 30 will be reflected into fiber 32 by the reflective filament 26. The dimensions of filaments 26 may be adjusted by adjusting the dimensions of the zener diodes. The ends of the fibers 30 and 32 may be polished so as to act as lenses to focus the light only upon the filament and better receive reflective light from the filament. To align the fibers, one or more "alignment" diodes might be zapped to assist with alignment, and/or fiducials of reflecting metal (e.g., contact 22 in FIG. 1) can be provided for that purpose.

FIG. 4 also shows an optional address decoder 36, used for selectively addressing the various zener diodes for programming. Decoder 36 may be a conventional X decoder matrix and a Y decode matrix. Electrical contacts or pads 38 may be formed around the periphery of the chip or anywhere else on the chip surface for connection to the various control and programming voltages.

The zener diode array can be programmed to convey an optical code (such as an identification number or other code), selectively switch light for optical communications, convey an optical image (e.g., for identification purposes), or convey any other information. The array has extremely high reliability and very low cost. The array of diodes may be a linear array or a two dimensional array.

Another advantage of this optical array is that the very X-Y code used to program/zap the diodes results in the digital code being "stored" in the programmed array so that copies of the array can easily be made and records can be kept and cross-referenced. This is not the case with MEMS type arrays. The programmed array can be both optically sensed and electrically sensed. Accordingly, the array may act as both an optical memory and an electrical memory for any data.

Figure 5:
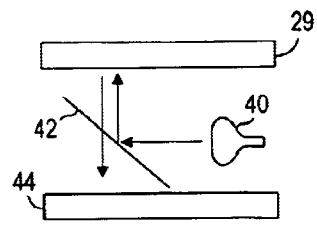
FIG. 5 illustrates another use of the array of zapped zener diodes, where the reflection from the array is used to selectively expose photosensitive portions of another substrate.

Another general use of the programmed zener diode array is for creating a light pattern used to selectively expose photosensitive portions on a wafer. FIG. 5 illustrates one such application. A UV light source 40, such as a laser or bulb, directs light onto a conventional half-silvered mirror 42. The light is directed upward and reflects off the programmed zener diode pattern on the diode array chip 29. This reflected pattern is then transmitted through mirror 42 to another substrate 44. In one application, substrate 44 has a photoresist layer or other photosensitive layer formed on it that is selectively exposed by the UV light reflected from chip 29. Suitable optics are provided to focus the reflected light onto substrate 44.

Some techniques to prevent undesired reflections from the array's metal lines and contacts have been described above. Additionally, the photosensitive layer on substrate 44 (or the regions underlying the photosensitive layer) may be patterned to not be adversely affected by reflections off the metal lines and contacts.

In one application, substrate 44 may be a DNA microarray having an array of chemically primed sites ready to bond nucleotides. The sites are capped by a photosensitive chemical that detaches under illumination. The UV light applied to substrate 44 causes the capping chemical to break away from the areas it strikes, thus exposing the selected sites. A solution containing one of four types of nucleotides (each molecule of which is itself attached to a capping molecule) is then washed over the substrate 44. The nucleotides bond only to the areas that have been exposed and add a capping layer themselves. The process is then repeated with another light exposure pattern, determined by a differently programmed zener diode array, and a different nucleotide is applied. In this manner, a variety of DNA sequences can be built up on substrate 44. Further description of such a sequence, but using a mask, is described in the article "Making Chips," by Samuel Moore, IEEE Spectrum, March 2001, pages 54–60.

The technique of FIG. 5 may also be applied to forming integrated circuits as well, where a layer of photoresist on a semiconductor wafer (substrate 44) is exposed and developed in an otherwise conventional photolithography process using the light reflected from the filament pattern.

Figure 6:
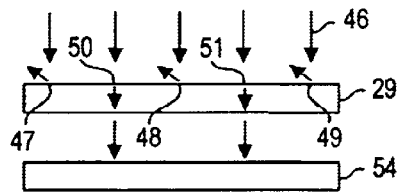
FIG. 6 illustrates yet another use of the array where the filaments block radiation from passing through the substrate, and the resulting radiation pattern is detected.

The optical array may also be used to selectively block (by reflection) radiation from going through the array substrate 29. FIG. 6 illustrates such an application. Radiation 46, such as infra-red radiation, is applied to the surface of substrate 29. The filaments in areas 47, 48, and 49 will block the radiation from going through substrate 29, while areas 50 and 51, not having a filament, will allow the radiation to pass through. A photodetector 54, containing an array of photosensitive elements, detects the radiation that passes through substrate 29. Conventional circuitry connected to photodetector 54 is used to X-Y address the photosensitive elements so as to detect which areas of substrate 29 pass the radiation. The photodetector 54 may be a conventional image sensor sensitive to the radiation wavelength.

Since each zener diode may be less than 100 microns by 100 microns, and as little as 10 microns by 10 microns or less, an array of greater than a million zener diodes may be formed on a chip. Given the simplicity of each zener diode, yields may be very high.

Since the programmed diode array is also electrically readable due to the filaments shorting the contacts, read circuitry can be provided on the chip so that electrical verification of the programmed codes can be performed and cross-checked with optical verification of the code. Such read circuitry can be circuitry 36 in FIG. 4. The read circuitry may also be an external circuit used to electrically sense the programmed code for any reason.

In some embodiments, the diodes or programming technique is designed such that the filaments 26 do not extend all the way between the two contacts so do not necessarily provide an electrical short. Although such programmed arrays can be used to convey optical information, they cannot be read electrically.

The concept of creating reflective filaments in an array of devices is also applicable to other than zener diodes. For example, an avalanche diode can be "zapped" to form a reflective filament between its two contacts. Other semiconductor devices such as NPN and PNP bipolar transistors, as well as MOSFETS, can be made to zap so as to produce useable and repeatable optically reflective filaments.

Figure 7:
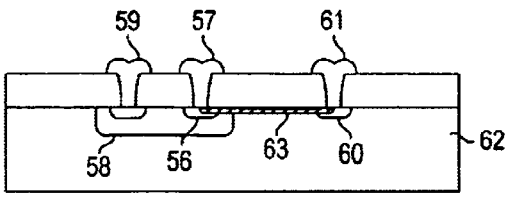
FIG. 7 is a cross-sectional view of a programmable bipolar transistor.

FIG. 7 illustrates a zapped NPN or PNP bipolar transistor showing emitter region 56, emitter contact 57, base region 58, base contact 59, collector region 60, collector contact 61, substrate 62, and filament 63. A sufficiently high programming voltage, current, and temperature will cause metal (e.g., aluminum) atoms from a contact to migrate between the oxide/substrate interface to form a reflecting surface. The semiconductor device may be used instead of the zener diode in all the described embodiments.

In another embodiment, semiconductor regions are not employed, and the filament is formed by breakdown of the interface between two contacts.

Figure 8:
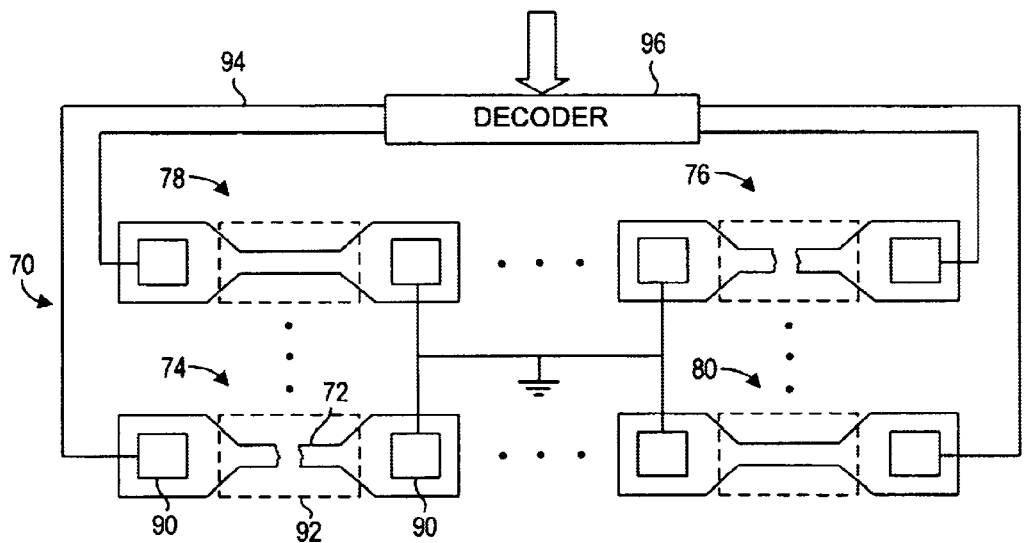
FIG. 8 is a top-down view of an array of normally-shorted programmed fuses, whose filament pattern is to be optically detected.

FIG. 8 is a top-down view of an array 70 of programmable fuses, where the fuses are selectively blown to create a gap in a conductive filament 72. In one embodiment, filament 72 is approximately 2–10 microns long and has a width of approximately 1–3 microns. These dimensions may be widely variable since each fuse is simply a conductive (e.g., metal) filament between two contacts, where the center portion of the filament "blows" (e.g., melts) due to a high programming current or voltage.

After a filament is blown, the gap in the filament may be, for example, 2–3 microns. In FIG. 8, fuses 74 and 76 are blown, while fuses 78 and 80 are intact.

Figure 9:
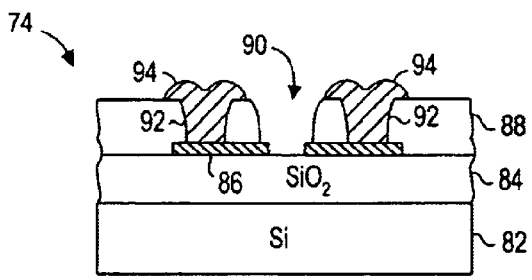
FIG. 9 is a cross-sectional view of one of the blown fuses of FIG. 8.

FIG. 9 is a cross-sectional view of a blown fuse 74. A starting substrate 82, such as silicon, has formed on it an insulating layer 84, such as an oxide layer. A conductive layer 86 is deposited and patterned using conventional photolithographic techniques to form the various fuses. Layer 86 may be any reflective conductive material, such as Al, TiN, TiW, SiCr, a polycide, or any other metal or alloy. The thickness of layer 86 depends on the material used and may range from approximately 100 Angstroms to 12,000 Angstroms or thicker.

A passivation layer 88, such as an oxide or nitride layer, is then formed over the a, surface of the wafer using conventional techniques. Opening 90 is formed in the passivation layer 88 to expose the filament portion of the fuse. Opening 90 may be on the order of 100×100 microns. Openings 92 are formed to expose contact areas of the fuse for connection thereto by metal traces 94. Many other configurations of fuses can be used.

A decoder 96 (FIG. 8), receiving external signals, may be coupled to traces 94 for individually addressing the fuses for programming.

The programmed array of fuses, having a pattern of reflective filament portions, may be used in any of the optical applications previously described. Any other types of fuses may also be used. Undesirable reflections from portions of the array other than the center of the filament area may be minimized or otherwise made inconsequential by using techniques described previously. An optical array may include a combination of any of the fuses described above.

Forming programmable fuses or anti-fuses on the surface of a substrate for the purpose of creating a reflective optical pattern may use conventional IC manufacturing techniques. In contrast, MEMs-type optical switches are extremely complex, have low yield, and are expensive. The present invention may substitute for existing optical switches in many applications and, due to the low cost of the optical arrays of the present invention, many new uses arise, as previously identified.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An optical device comprising:
   programmable elements formed on a surface of a substrate, said programmable elements capable of being selectively programmed to create a reflective filament pattern for reflecting radiation in a selected optical pattern; and
   an address decoder on said substrate for selectively addressing said programmable elements for programming.

2. The optical device of claim 1 wherein said programmable elements are formed in a two dimensional array.

3. The optical device of claim 1 wherein each of said programmable elements has conductive contacts, and wherein said conductive contacts are selected from metals consisting of aluminum and aluminum alloys.

4. The optical device of claim 1 further comprising a package containing said substrate, said package having a window exposing said programmable elements, said package having conductive terminals for programming said programmable elements.

5. The optical device of claim 1 wherein said selected optical pattern is an optical image.

6. The optical device of claim 1 wherein said selected optical pattern is an optical code.

7. The optical device of claim 1 wherein said selected optical pattern is a pattern for exposing photosensitive material.

8. The optical device of claim 1 wherein said programmable elements are diodes.

9. The optical device of claim 1 wherein said programmable elements are zener diodes.

10. The optical device of claim 1 wherein said programmable elements are transistors.

11. The optical device of claim 1 further comprising semiconductor regions over which are formed conductive contacts for each of said programmable elements.

12. The optical device of claim 1 wherein said substrate is a semiconductor substrate.

13. The optical device of claim 1 wherein said reflective filament pattern is both optically detectable, by detecting said optical pattern, and electrically detectable, by detecting electrical shorts between in said contacts reflective filament pattern.

14. The optical device of claim 1 wherein said programmable elements comprise normally-shorting conductive filaments between contact areas, said normally-shorting conductive filaments forming an open circuit between said contact areas when blown during programming.

15. A method for selectively reflecting light comprising:
providing programmable elements on a surface of a substrate;
programming said programmable elements to create a pattern of reflective filaments; and
applying radiation to said surface, such that radiation is reflected from said pattern of reflective filaments in a selected pattern.

16. The method of claim 15 wherein said selected pattern conveys optical information.

17. The method of claim 15 wherein said selected pattern is an optical image.

18. The method of claim 15 wherein said selected pattern is an optical code.

19. The method of claim 15 wherein said selected pattern is a pattern for exposing photosensitive material to light.

20. The method of claim 15, further comprising:
detecting a pattern of radiation that has passed through said substrate, said pattern of reflective filaments at least partially blocking said radiation from passing through said substrate.

21. The method of claim 15 wherein said programmable elements are diodes.

22. The method of claim 15 wherein said programmable elements are zener diodes.

23. The method of claim 15 wherein said programmable elements are transistors.

24. The method of claim 15 wherein each of said programmable elements are comprises a normally-shorting conductive filaments between two filament contact areas.

25. The method of claim 15 wherein said programmable elements are fuses.

26. The method of claim 15 wherein said programmable elements are anti-fuses.

27. An optical device comprising:
programmable elements formed on a surface of a substrate, said programmable elements capable of being selectively programmed to create a reflective filament pattern for reflecting radiation in a selected optical pattern; and
a read circuit electrically coupled to said programmable elements for reading said programmable elements after programming.

28. The optical device of claim 27 wherein said read circuit is formed on said substrate.

29. A device comprising one or more programmable elements, the one or more programmable elements being selectively programmable to create a reflective filament pattern for creating a selected optical pattern.

30. The device of claim 29, wherein each of the one or more programmable elements comprises:
a first contact; and
a second contact, wherein applying a programming current or a programming voltage across the first contact and the second contact of a selected one of the one or more programmable elements programs the selected one of the one or more programmable elements.

31. The device of claim 30, wherein the first contact and the second contact in each of the one or more programmable elements are formed of metal, and wherein applying the programming current or the programming voltage across the first contact and the second contact causes migration of the metal between the first contact and the second contact to form at least one reflective filament.

32. The device of claim 31, wherein the at least one reflective filament comprises a single reflective filament connecting the first contact to the second contact.

33. The device of claim 31, wherein the at least one reflective filament comprises a first reflective filament extending from the first contact, wherein the first reflective filament does not provide an electrical short between the first contact and the second contact.

34. The device of claim 31, wherein the metal comprises aluminum or an aluminum alloy.

35. The device of claim 31, wherein each of the one or more programmable elements comprises a diode.

36. The device of claim 35, wherein the diode comprises a zener diode.

37. The device of claim 35, wherein the diode comprises an avalanche diode.

38. The device of claim 31, wherein each of the one or more programmable elements comprises a transistor.

39. The device of claim 30, wherein each of the one or more programmable elements includes a reflective filament between the two contacts, and wherein applying the programming current or the programming voltage across the first contact and the second contact melts the reflective filament to create a gap in the reflective filament.

40. The device of claim 29, further comprising an address decoder for selectively addressing the one or more programmable elements for programming.

41. The device of claim 29, further comprising a read circuit electrically coupled to the one or more programmable elements for reading the reflective filament pattern.

42. The device of claim 29, wherein the selected optical pattern is formed by portions of an incident radiation beam reflected by the reflective filament pattern.

43. The device of claim 29, wherein the selected optical pattern is formed by portions of an incident radiation beam not reflected by the reflective filament pattern.

44. A method of conveying optical information, the method comprising:

providing an optical device programmed to include a plurality of reflective filaments forming a reflective filament pattern, the optical device comprising a first plurality of contact pairs and a second plurality of contact pairs, each of the first plurality of contact pairs being coupled by at least one of the plurality of reflective filaments, and none of the second plurality of contact pairs being coupled by any of the plurality of reflective filaments; and directing radiation at the reflective filament pattern to generate an optical pattern, the optical pattern carrying the optical information.

45. The method of claim 44, wherein the first plurality of contact pairs and the second plurality of contact pairs are formed from metal on a semiconductor substrate, and wherein the plurality of reflective filaments are formed by metal migration between each of the first plurality of contact pairs.

46. The method of claim 45, wherein the metal comprises aluminum or an aluminum alloy.

47. The method of claim 44, wherein the first plurality of contact pairs and the second plurality of contact pairs form contacts for semiconductor devices.

48. The method of claim 44, wherein each of the first plurality of contact pairs forms contacts for an unblown fuse, and wherein each of the second plurality of contact pairs forms contacts for a blown fuse.

49. The method of claim 44, further comprising receiving the optical pattern to acquire the optical information.

50. The method of claim 49, wherein receiving the optical pattern comprises directing a portion of the optical pattern into an optical fiber.

51. The method of claim 49, wherein receiving the optical pattern comprises exposing a photosensitive layer with the optical pattern.

52. The method of claim 51, wherein the photosensitive layer comprises a photoresist layer on a semiconductor substrate.

53. The method of claim 51, wherein the photosensitive layer comprises a photosensitive chemical capping bonding sites on a DNA microarray.

54. The method of claim 44, wherein the optical pattern is formed by radiation reflected by the reflective filament pattern.

55. The method of claim 44, wherein the optical pattern is formed by radiation not reflected by the reflective filament pattern.

56. An optical assembly comprising:

an optical device programmed to include a plurality of reflective filaments forming a reflective filament pattern, the optical device comprising a first plurality of contact pairs and a second plurality of contact pairs, each of the first plurality of contact pairs being coupled by at least one of the plurality of reflective filaments, and none of the second plurality of contact pairs being coupled by any of the plurality of reflective filaments; and a light source for directing light at the reflective filament pattern to generate an optical pattern.

57. The optical assembly of claim 56, further comprising at least one optical fiber for receiving the optical pattern from the optical device.

58. The optical assembly of claim 56, wherein the first plurality of contact pairs and the second plurality of contact pairs form contacts for a plurality of semiconductor devices.

59. The optical assembly of claim 58, wherein the semiconductor devices comprise zener diodes.

60. The optical assembly of claim 58, wherein the semiconductor devices comprise avalanche diodes.

61. The optical assembly of claim 58, wherein the semiconductor devices comprise transistors.

62. The optical assembly of claim 56, wherein each of the first plurality of contact pairs forms contacts for an unblown fuse, and wherein each of the second plurality of contact pairs forms contacts for a blown fuse.

* * * * *

UNITED STATES PATENT AND TRADEMARK OFFICE
CERTIFICATE OF CORRECTION

PATENT NO. : 6,711,046 B1
DATED : March 23, 2004
INVENTOR(S) : Martin Alter

It is certified that error appears in the above-identified patent and that said Letters Patent is hereby corrected as shown below:

Column 7,
Line 31, delete the words "between" and "contacts".
Line 66, delete the word "are".
Line 67, replace the word "filaments" with -- filament --.

Signed and Sealed this

Twenty-third Day of November, 2004

JON W. DUDAS
*Director of the United States Patent and Trademark Office*